United States Patent
Buer

(10) Patent No.: US 6,362,689 B1
(45) Date of Patent: Mar. 26, 2002

(54) MMIC FOLDED POWER AMPLIFIER

(75) Inventor: Kenneth V. Buer, Gilbert, AZ (US)

(73) Assignee: U.S. Monolithics, L.L.C., Chandler, AZ (US)

( * ) Notice: Subject to any disclaimer, the term of this patent is extended or adjusted under 35 U.S.C. 154(b) by 0 days.

(21) Appl. No.: 09/667,942

(22) Filed: Sep. 22, 2000

(51) Int. Cl.⁷ .......................... H03F 3/68; H03F 3/145
(52) U.S. Cl. ...................................... 330/295; 330/307
(58) Field of Search ................................ 330/277, 286, 330/295, 307

(56) References Cited

U.S. PATENT DOCUMENTS

| | | | |
|---|---|---|---|
| 5,023,677 A | 6/1991 | Truitt | 357/22 |
| 5,519,358 A | 5/1996 | Tserng | 330/307 |
| 5,659,267 A * | 8/1997 | Buer et al. | 330/277 |
| 5,821,827 A * | 10/1998 | Mohwinkel et al. | 331/99 |
| 5,952,886 A | 9/1999 | Buer et al. | 330/295 |

* cited by examiner

*Primary Examiner*—Steven J. Mottola
(74) *Attorney, Agent, or Firm*—Snell & Wilmer L.L.C.

(57) ABSTRACT

A MMIC (microwave monolithic integrated circuit) power amplifier and method for the same is provided. A smaller die size and higher power output are realized with the improved transistor geometry herein provided. In particular, transistors, such as FETs (field effect transistors) are displaced from a conventional FET geometry with alternating FETs being rotated in opposite directions. The inputs (gate pads) and outputs (drain pads) of two adjacent FETs may be "shared." The improved configuration reduces the number of splitting and combining networks by up to 50% over the prior art. The die area for a typical 4 watt power amplifier is reduced by 48–72% over the prior art.

21 Claims, 5 Drawing Sheets

MMIC FOLDED POWER AMPLIFIER

FIELD OF INVENTION

The present invention relates generally to power amplifiers, in particular, to microwave power amplifiers and, more particularly to an improved monolithic microwave integrated circuit (MMIC) power amplifier.

BACKGROUND OF THE INVENTION

Increasing the power output in power amplifiers, such as monolithic microwave integrated circuit (MMIC) power amplifiers, typically requires increasing the number of FETs (field effect transistors) or, in particular applications, the number of Bipolar-type devices. Including more FETs typically requires a larger MMIC die size due to the arrangement of the FETs on the die and requirements of the combiner and divider networks. However, larger MMIC die are more expensive as cost is approximately proportional to die size. Thus, smaller MMIC die size is more desirable because of reduced cost.

Various attempts have been proposed to reduce the die size of power amplifiers, such as that disclosed by Tserng, U.S. Pat. No. 5,519,358. Tserng proposes a "folded FET" configuration to pack the transistors into a compact area. However, Tserng does not allow for symmetric dividers and combiners for an even mode operation of the transistors.

Buer et al., U.S. Pat. No. 5,952,886, attempts to overcome some of the problems of Tserng and proposes a diagonally orientated FET configuration. Buer et al. discloses that the "staggered" FET arrangement permits more FETs to be placed across the MMIC chip than a "stack-up" configuration. In addition, Buer et al. discloses multiple matching and combiner networks for even mode operation. However, the staggered configuration of Buer et al. increases the design time and difficulty due to the precise FET overlap angles needed for optimum performance. In addition, Buer et al. provides for matching circuitry on only one side of the FET arrangement, thereby decreasing matching circuit effectiveness as well as performance and increasing the risk of oscillation. Furthermore, Buer et al. includes a wide bias interconnection loop in the center of the chip to deal with inherent geometry problems associated with injecting bias current in the configuration. This additional circuitry can take valuable space on the die which is generally not desirable.

Accordingly, there exists a need for a high power MMIC amplifier that reduces the die size. In addition, there is a need for a lower cost power amplifier. Further, there is a need for an improved performance power amplifier having higher output power, higher gain and increased efficiency.

SUMMARY OF THE INVENTION

The present invention overcomes the problems outlined above and provides an improved power amplifier. In particular, the present invention provides a MIMIC power amplifier with an improved FET geometry. More particularly, the present invention provides a MIMIC power amplifier with a folded configuration, improved performance, reduced number of combining circuits, and reduced die size.

In accordance with one embodiment of the present invention, a microwave power amplifier includes a plurality of FETs in a folded configuration having shared inputs and outputs.

BRIEF DESCRIPTION OF THE DRAWINGS

These and other features, aspects and advantages of the present invention will become better understood with reference to the following description, appending claims, and accompanying drawings where:

DETAILED DESCRIPTION OF EXEMPLARY EMBODIMENTS

The present invention relates to an improved power amplifier and more particularly, to an improved monolithic microwave integrated circuit (MMIC) power amplifier. Although the power amplifier disclosed herein may be suitable for mobile communication in a variety of applications, the present invention may be conveniently described with reference to commercial satellites systems or terrestrial point to multi-point communication systems, and more particularly to ground based Ka-band transmitters operating between about 26.5 GHz and 32 GHz. In addition, reference is made to a FET (field effect transistor) power amplifier; however, it should be appreciated and understood by one skilled in the art that various other transistors may appropriately be used in the present invention, for example, bipolar junction transistors (BJTs) and heterojunction bipolar transistors (HBTs).

Figure 1:
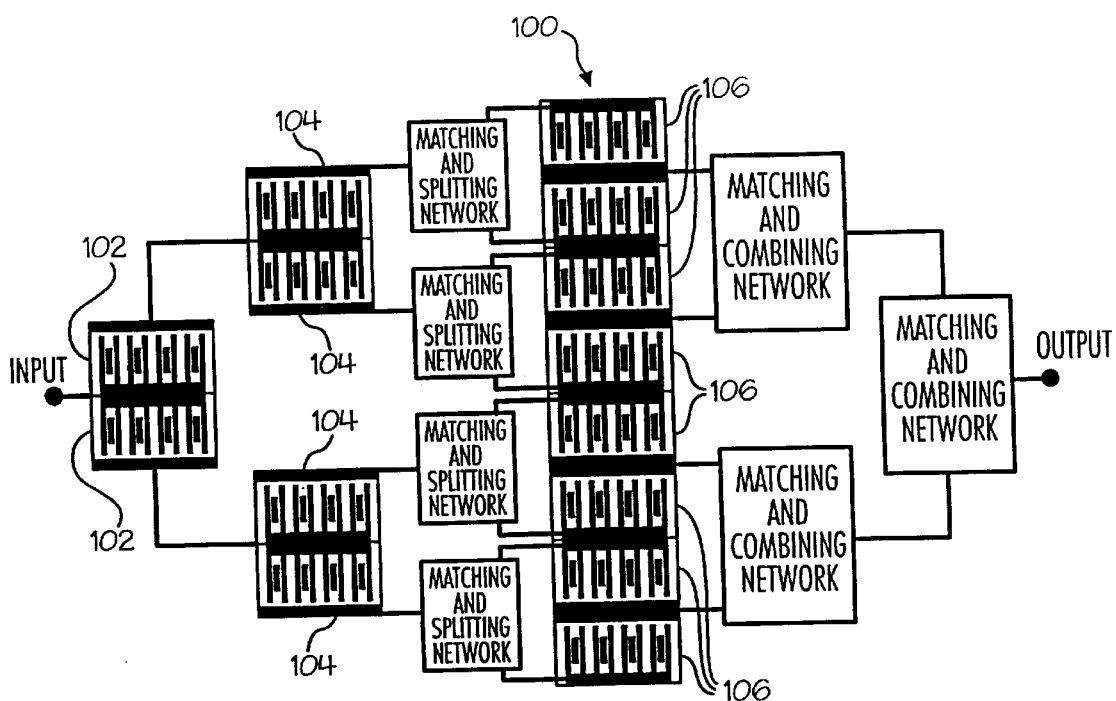
FIG. 1 illustrates a simplified layout of a MMIC power amplifier in accordance with the present invention.

FIG. 1 illustrates an exemplary layout of a MMIC power amplifier 100 in accordance with one embodiment of the present invention. MMIC power amplifier 100 includes three stages of parallel signal amplification (i.e., a 2-4-8 topology). It should be appreciated that the number of stages of amplification can vary and the number of FETs (field effect transistors) making up each stage can also vary depending upon the power drive needed for a particular application. The first stage of amplification of the present embodiment is provided by FETs 102, the second stage by FETs 104, and the third stage by FETs 106.

Figure 2A:
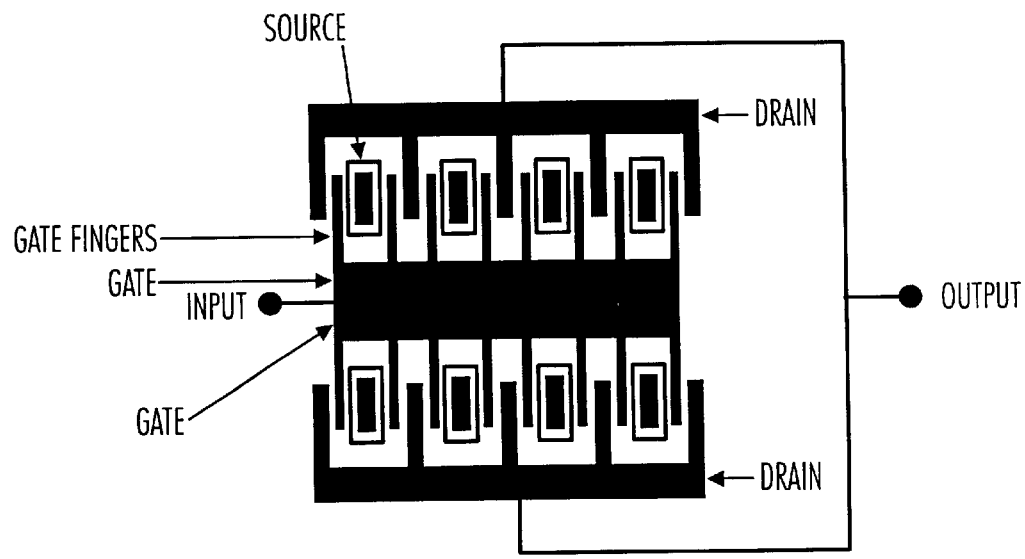
FIGS. 2A and 2B illustrate exemplary folded-FET configurations in accordance with the present invention.
Figure 2B:
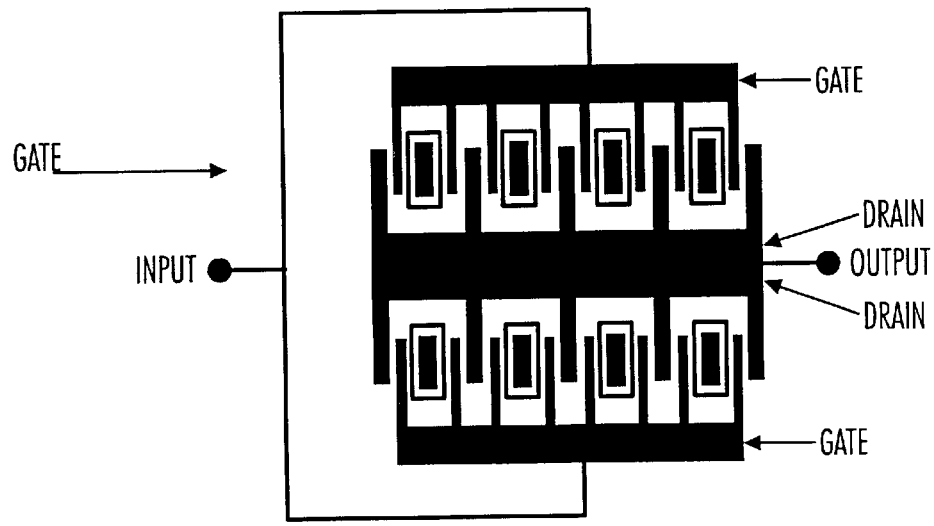

One aspect of the present invention relates to its "folded" configuration. Referring now to FIGS. 2A and 2B, two adjacent FET cells in accordance with the present invention are illustrated. Each of the unit FET cells is rotated 90° from a conventional FET cell configuration, thus the orientation of each FET appears to be "folded" with respect to the conventional orientation. The improved folded orientation of the present invention provides for a shared input and shared output at the gate and drain regions respectively for two adjacent FETs. Alternating FETs may be rotated in the opposite direction so that adjacent gates can be fed from a single point and/or adjacent drains can be power combined at the device output. The particular aspects of the shared input and output will be discussed in detail below. The improved FET geometry of the present invention provides many benefits over the prior art, for example, reduced die size, increased reliability, and improved performance, the details of which will be discussed below.

Figure 3:
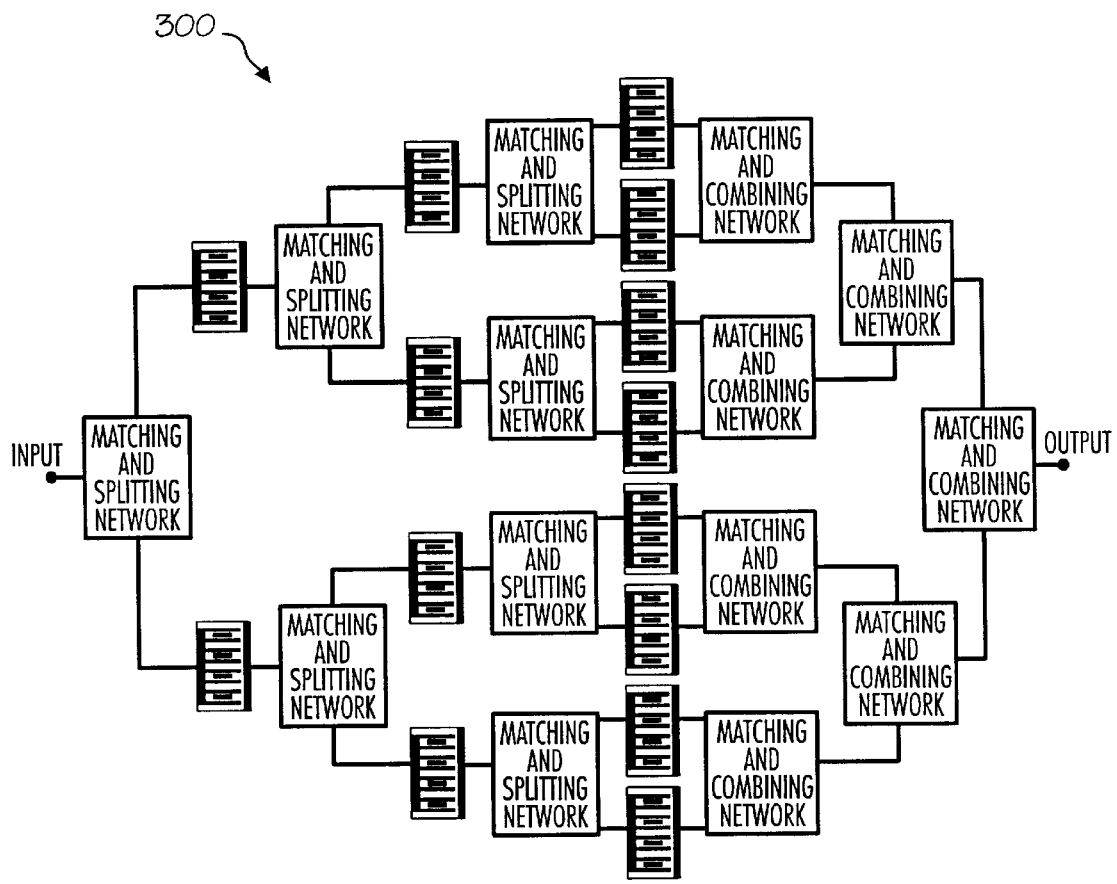
FIG. 3 illustrates a simplified conventional layout of a MMIC power amplifier of the prior art.

Referring now to FIG. 3, the layout of a prior art MIMIC power amplifier 300 is illustrated. Amplifier 300 includes a plurality of FETs placed in a conventional configuration, i.e., placed end-to-end (the gates and drains of each stage are in vertical alignment). For simplified comparison, amplifier 300 is shown in a typical three stage amplification 2-4-8 topology. In operation, the thermal effects of power amplifiers are typical of various other circuitry in the industry. More particularly, the power dissipates as the temperature increases. The heating caused by power dissipation reduces the overall power and gain of the amplifier. The heat generated by one FET can transfer and add to the heating from another FET and significantly increase the thermal problem. Due to the "end-to-end" geometry of amplifier 300, the active regions (gate fingers) are in close proximity and facilitate the mutual heating effects of two nearby devices. To alleviate the thermal effects, the configuration of amplifier 300 (and other similar prior art devices) includes a small separation (e.g., 50 μm) between each of the FETs. "Dead" space on the die, e.g., space used only to separate the FETs to reduce the thermal effects, increases the size of the die and therefore increases the cost of manufacture.

Referring again to FIGS. 2A and 2B, the folded configuration of the present invention avoids the need for "dead" space used to reduce the thermal effects. Thermal advantage is gained by separating the active regions (for example, the gate fingers) to reduce the mutual heating effects between two adjacent FETs. The present invention provides for a natural separation of about 80 to 100 μm. For example, with continued reference to FIGS. 2A and 2B, the gate and drain regions of two adjacent FETs provides sufficient separation of the active regions to reduce the heating effects. The geometry of the present invention allows the devices to run 20–30° C. cooler than conventional devices in, for example, a typical 4 watt power design. The cooler operating temperature increases the reliability and extends the expected lifetime of the MMIC power amplifier of the present invention by a factor of about four to eight times longer than a conventional MMIC power amplifier of the prior art. In addition, improved performance results from the reduced FET junction temperatures. For example, a 20–30° C. reduction in junction temperature results in the power amplifier of the present invention increasing output by about 0.4 dB and increasing gain by about 1.3 dB.

Prior art amplifier 300 includes a large number of matching and splitting/combining networks. The splitting/combining networks, as the name suggests, evenly split the input power delivered to the FETs and then combine the output power. Splitting/combining networks are common in the industry. Thus, it should be appreciated that the exact circuitry for the networks need not be discussed herein, but rather is typically an engineering design which varies with the particular topology of the amplifier. It is advantageous to match the FETs for even mode operation. As illustrated in exemplary FIG. 3, a significant amount of die area is consumed by the matching and splitting/combining networks. In fact, the layout of amplifier 300 includes more die area for matching and splitting/combining networks than for FETs.

Referring again to exemplary FIG. 1 of the present invention, the number of matching and splitting/combining networks is significantly reduced compared to the prior art MMIC power amplifier of FIG. 3. The present invention alternates two adjacent FETs in opposite directions so that alternating gate and drain interconnects may be "shared." The sharing of gate pads (input) reduces circuit area by reducing at least one level of splitting. The sharing of drain pads (output) reduces circuit area by providing one level of circuit combining at the drain of the device. The improved geometry of the present invention reduces the number of matching and splitting/combining networks by up to 50% over the prior art. Reducing the number of combiner and splitter layers reduces the space required on the die for circuitry performing this function. In addition, the reduction in combiner and splitter layers improves the performance of the power amplifier by reducing the loss associated with output combining. The improved MMIC power amplifier configuration of the present invention provides reduced numbers of matching and splitting/combining networks which results in smaller die area, higher output power and higher gain.

As previously mentioned, FIGS. 2A and 2B exemplify a shared input and a shared output respectively of a FET arrangement in accordance with the present invention. In the shared topology of the present invention, the input to two adjacent FET cells is shared at the gates of each of the FETs (FIG. 2A). The output of two adjacent FET cells is shared at the drains of each of the FETs (FIG. 2B). The "shared" configuration does not require any changes to the basic structure of the FET device. Therefore, a standard unit FET cell may be used which is well understood and characterized at high frequency for parasitic behavior.

The shared input and output further reduces power loss due to path length differences by feeding the device from one side of the FET (see e.g., FIG. 2A) and connecting the drain from the other side (see e.g., FIG. 2B). The differences in path length through center and edge fingers can limit the number of fingers available in a FET device. For example, at high frequencies, the path length differences can cause significant power loss due to vector summation at different phases. The configuration of the present invention is substantially free from path length differences, thus the number of gate fingers may be limited only by impedance matching concerns.

Figure 4:
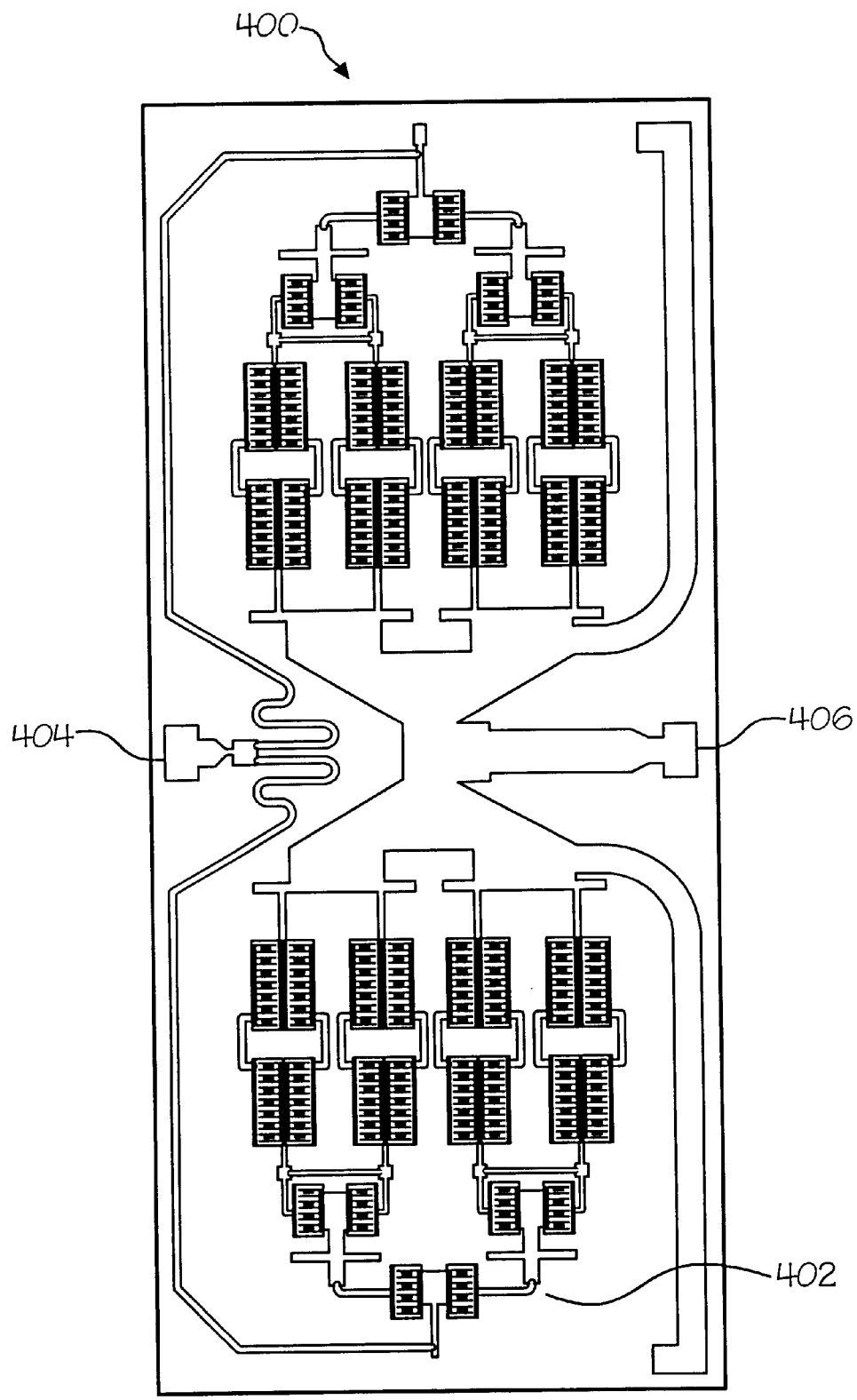
FIGS. 4 and 5 illustrate circuit layouts of MMIC power amplifiers in accordance with various embodiments of the present invention.

Referring now to FIG. 4, a simplified MMIC layout of a power amplifier 400 in accordance with the present invention is illustrated. An RF signal at an input port 404 of power amplifier 400 is amplified by multiple FET stages The outputs of the final stage may be combined through an output matching and combining network to provide one output signal at an output port 406. Exemplary amplifier 400 may, for example, include a 30 GHz input and a 4 W output power amplifier having four stages of amplification (i e., 2-4-8-8 topology). The improved FET configuration provides all of the FET fingers with equal through phase resulting in improved power combining (less loss) of the FET fingers.

Power amplifier 400 may be fabricated on any suitable MMIC substrate (i.e., chip, die) 402 of a suitable semiconductor material such as silicon (Si), gallium arsenide (GaAs), germanium (Ge), indium phosphide.(InP), and combinations such as mixed silicon and germanium, mixed silicon and carbon, and the like.

The embodiments shown in FIGS. 1, 2A, 2B and 4 are suitable for any microwave and millimeter frequency range. If a typical frequency around 30 GHz is chosen, the length of the MMIC chip 400, in accordance with the present invention, is approximately 4.2 mm and the width is approximately 2.0 mm. In contrast, a conventional 30 GHz MMIC power amplifier with similar performance characteristics (e.g., amplifier 300 of FIG. 3) requires a die size of approximately 5.5 mm length and 5.5 mm width. There have been attempts at reducing the die size using various FET configurations. For example, Buer et al., U.S. Pat. No. 5,952,886, discloses a diagonally oriented FET configuration. The power amplifier of Buer et al. is fabricated on a MMIC chip with a length of 4.65 mm and a width of 3.5 mm. The MMIC power amplifier of the FIG. 4, in accordance with the present invention, illustrates roughly a 48% smaller die area than Buer et al. and a 72% smaller die area than a conventional MMIC amplifier.

The reduced die size of the present invention provides easier handling and assembly of the die. For example, in the past, the relatively thin 2-mil die (i.e., 50 μm) was extremely susceptible to breakage, and as the die area increased, the chance of breakage increased. Moreover, smaller die area decreases the probability of random die defects within the die itself and reduces the chance of solder voids in the attach process. One skilled in the art will readily recognize the benefits of the reduced die size provided by the present invention including, but not limited to, the improved production yield. Some of the advantages of the present invention are herein described with respect to a 2-mil die, for among the same and other reasons, it should be appreciated that the present invention is equally as advantageous for other die sizes (e.g., 1-mil, 4-mil, 8-mil, and the like).

Figure 5:
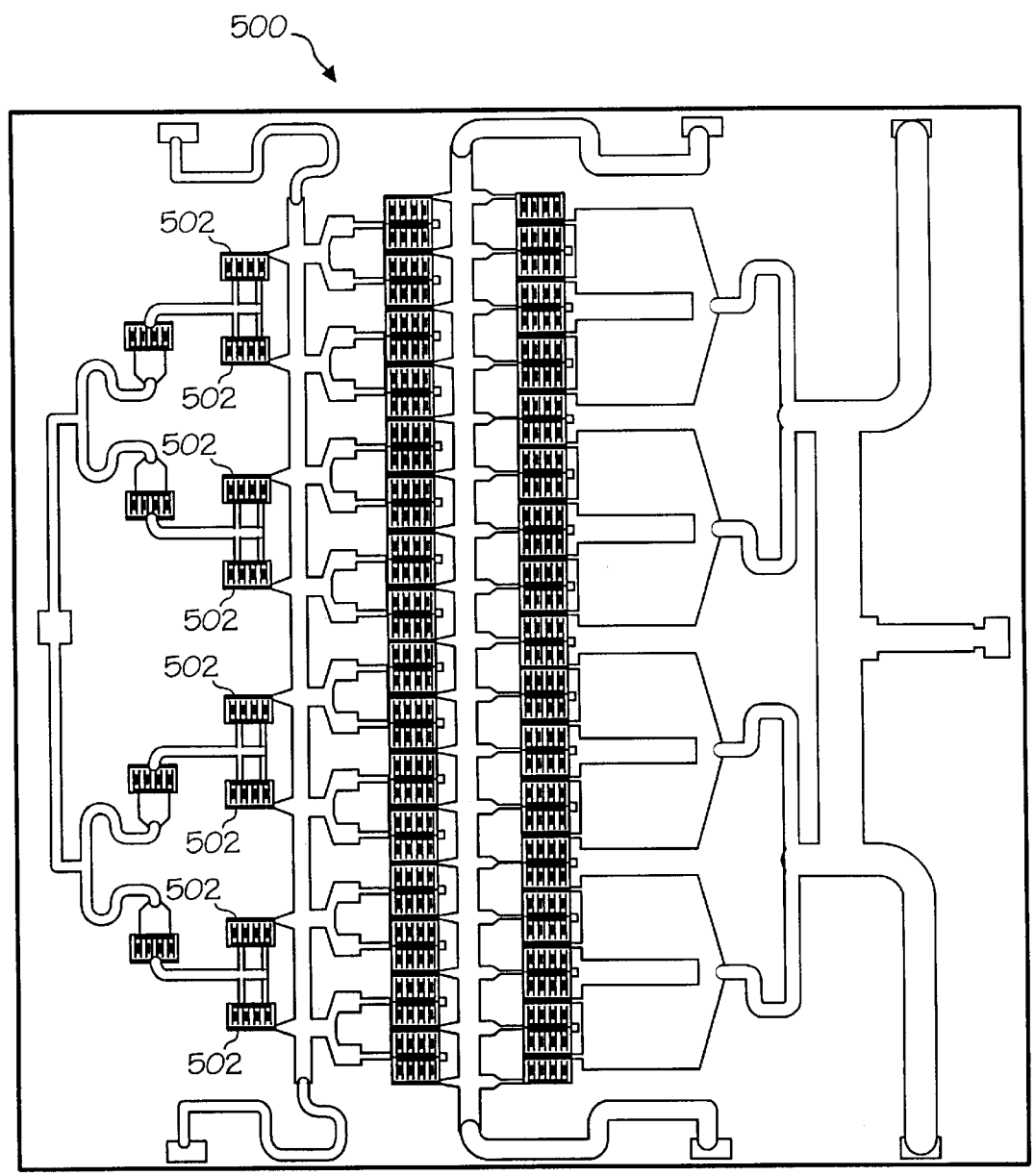

FIG. 5 illustrates a MMIC power amplifier 500 in accordance with another embodiment of the present invention. Amplifier 500 is a four stage amplifier having a 4-8-32-32 topology. As previously mentioned, the number of stages in a power amplifier can vary and is generally dependent upon the gain and frequency of the particular application The number of transistors in each stage is generally dependent upon the level of power drive needed for the particular application. As one skilled in the art will readily recognize, amplifier 500 is a high power amplifier having an output of around 6 watts.

The second stage of amplification includes, for example, eight FETs 502 in a folded FET configuration. In this embodiment, FETs 502 do not include a shared input or shared output. The remaining two stages of amplification (32 FETs and 32 FETs) are in a folded FET configuration with both shared inputs and shared outputs in a manner previously discussed for FIGS. 1–4. Thus, for some power amplification applications it may be desirable to only share some of the inputs and only some of the outputs (e.g., for FET aligning purposes).

Power amplifier 500 in accordance with the present invention is a 6 watt amplifier and is approximately 5.5 mm in length and 5.0 mm in width. A 4 watt amplifier of the prior art having a conventional FET configuration (e.g., FIG. 3) has approximately the same die area as exemplary 6 watt power amplifier 600. Ideally, a large number of FETs arranged in multiple stages could be included on a die to increase the power output. However, as the die size increases to accommodate the increased number of FETs, the strength of the die decreases, thereby increasing the risk of die breakage. Die areas in the range of 30 to 35 mm are generally accepted in the industry as a "safe" maximum area. Areas greater than 35 mm significantly decrease the die yield due to increased die breakage and increased probability of random die defects. The present invention can suitably be used to increase the power output of a power amplifier by 50% without jeopardizing the die yields by increasing the die size beyond an undesirable range.

It should be appreciated that the particular implementations shown and described herein are illustrative of various embodiments of the invention including its best mode, and are not intended to limit the scope of the present invention in any way. Indeed, for the sake of brevity, conventional techniques for signal processing, data transmission, signaling, and network control, and other functional aspects of the systems (and components of the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in a practical communication system.

The present invention has been described above with reference to exemplary embodiments. However, those skilled in the art having read this disclosure will recognize that changes and modifications may be made to the embodiments without departing from the scope of the present invention. For example, various types of transistors aside from FETs are contemplated, such as BJTs and HBTs. These and other changes or modifications are intended to be included within the scope of the present invention, as expressed in the following claims.

What is claimed is:

1. A power amplifier comprising:
   a plurality of transistors each having an input and an output, the transistors arranged in a folded configuration such that each of the FETs includes gate fingers in vertical alignment with the gate fingers of another FET;
   signal splitter circuitry for providing substantially in-phase signals to the transistors; and
   combiner circuitry for in-phase combining outputs of the transistors.

2. The power amplifier of claim 1 comprising field effect transistors (FETs).

3. The power amplifier of claim 1 wherein adjacent transistors share inputs.

4. The power amplifier of claim 1 wherein adjacent transistors share outputs.

5. The power amplifier of claim 1 comprising a multi-stage configuration of transistors.

6. The power amplifier of claim 5 wherein the signal splitter circuitry provides substantially in-phase signals to a final stage of the multi-stage configuration.

7. The power amplifier of claim 5 wherein the combiner circuitry provides for in-phase combining outputs of a final stage of the multi-stage configuration.

8. A power amplifier comprising:
   a plurality of FETs arranged on a die in a folded configuration such that the gate fingers of at least one of the FETs is in vertical alignment with the gate fingers of another FET;
   a shared gate connection of at least two of the FETs; and
   a shared drain connection of at least two of the FETs.

9. The power amplifier of claim 8 wherein the shared gate connection comprises an in-phase signal input.

10. The power amplifier of claim 8 wherein the shared drain connection comprises an in-phase output.

11. The power amplifier of claim 8 further comprising matching and combining circuitry.

12. The power amplifier of claim 8 comprising one of a 1-mil, a 2-mil, a 4-mil, or a 8-mil die.

13. The power amplifier of claim 8 wherein the die comprises a semiconductor material.

14. The power amplifier of claim 8 wherein the die material is selected from the group consisting of gallium arsenide, indium phosphide or silicon.

15. A method for power amplification comprising the steps of:
   providing a plurality of FETs coupled to each other, the FETs having a gate, a drain, and a plurality of gate fingers where the gate fingers of one FET are vertically aligned with the gate fingers of an adjacent FET;
   receiving an in-phase signal at a gate of one of the FETs coupled to the gate of a second FET;
   outputting an in-phase signal from a drain of one of the FETs coupled to the drain of a another FET; and combining the outputs from multiple coupled FETs to provide one output signal.

16. The method of claim 15 wherein the receiving step further comprises:
   orientating two FETs in opposite directions; and
   receiving the signal at a point coupled to the gates of both FETs.

17. The method of claim 15 wherein the outputting step further comprises:
   orientating two FETs in opposite directions; and
   receiving the signal at a point coupled to the drains of both FETs.

18. The method of claim 15 further comprising the step of arranging the plurality of FETs on a die.

19. The method of claim 18 comprising arranging the FETs in a folded configuration.

20. The method of claim 18 comprising a semiconductor die selected from the group consisting of gallium arsenide, indium phosphide or silicon.

21. The method of claim 18 comprising a die selected from the group consisting of 1-mil, 2-mil, 4-mil or 8-mil.

* * * * *